United States Patent [19]
Di Cicco

[11] Patent Number: 4,517,526
[45] Date of Patent: May 14, 1985

[54] DIGITALLY CONTROLLED AGC AMPLIFIER

[75] Inventor: Thomas A. Di Cicco, Farmingdale, N.Y.

[73] Assignee: Comtech Telecommunications Corp., N.Y.

[21] Appl. No.: 498,087

[22] Filed: May 25, 1983

[51] Int. Cl.³ .............................................. H03G 3/30
[52] U.S. Cl. ................................... 330/284; 330/129; 330/279; 333/81 R
[58] Field of Search .................... 330/129, 279, 284; 333/81 R

[56] References Cited
U.S. PATENT DOCUMENTS
4,249,144 2/1981 Hurst et al. ..................... 333/81 R OTHER PUBLICATIONS
By: Gary M. Hover in Microwaves & RF, Apr., 1983, pp. 83-84 entitled "PIN-Diode Driver Allows Linear RF Attenuation".

Primary Examiner—James B. Mullins
Assistant Examiner—Steven J. Mottola
Attorney, Agent, or Firm—Brumbaugh, Graves, Donohue & Raymond

[57] ABSTRACT

In a predetection combiner there is provided AGC amplifier which uses an electronically controlled RF attenuator, such as a PIN-diode attenuator, which is linearly controlled by use of digital signals. A programmed read-only-memory provides a linearity correction for generating the appropriate control voltage for the diode attenuation device.

20 Claims, 5 Drawing Figures

DIGITALLY CONTROLLED AGC AMPLIFIER

BACKGROUND OF THE INVENTION

The present invention relates to AGC amplifiers and particularly such amplifiers for predetection combiners.

In a predetection combiner of the type used in a receiver for a tropospheric scattering communications system, component signals which are received on a plurality of antennas are adjusted to have equal phase and combined to provide a composite signal with enhanced signal-to-noise ratio. The receiver circuits prior to the combiner usually include automatic gain control (AGC) amplifiers in each channel, which adjust the gain of each channel to provide a combined composite signal with a desired power level.

In such a combining circuit it is important to provide accurate tracking of the gain of each amplifier, so that all channels will have the same gain in response to a specified level of AGC control signal. Gain control is usually provided by PIN-diode attenuators in each channel.

In order to attain near theoretical combining results, several factors must be considered. The most important factors include equal front end noise and coherent modulation in each component signal channel, and equal and identical gain characteristics of each component channel. Of the aforementioned factors, only the gain characteristic is within the control of the combiner designer.

To accomplish equal gain transfer characteristics in each of two or more channels, prior systems resort to complex circuitry and tedious alignment procedure. The circuits provide predistortion of AGC voltages. Circuit components are selected for matched characteristics, and hours of alignment are required to achieve tracking errors in the order of 0.5 to 1 dB over the dynamic range of 60 dB. It is well known that the attenuation provided by a PIN-diode attenuator is a non-linear function of the voltage applied to the diode. Attempts in the prior art to provide a linear characteristic for such attenuators have generally taken the approach of providing a non-linear analog circuit, which compensates for the non-linear characteristics of the diode. A recent article showing this approach was published by Gary M. Hover in Microwaves & RF, April, 1983 pp. 83–84, entitled "PIN-Diode Driver Allows Linear RF Attenuation". This approach is not capable of yielding high accuracy for attenuation as a function of applied AGC voltage. Another problem with this approach is the fact that diode characteristics can vary from one part to another, and this variation can provide substantial inaccuracies in the resulting product unless the analog circuit is individually adjusted for each diode.

It is therefore an object of the present invention to provide a predetection combiner having AGC amplifiers with improved linearity.

It is a further object of the present invention to provide an AGC amplifier with linear control characteristics.

It is a still further object of the present invention to provide an AGC amplifier with digital control.

It is a still further object of the present invention to provide a linear attenuator with digital control.

SUMMARY OF THE INVENTION

In accordance with the present invention, there is provided an improved predetection combining system which is responsive to a plurality of component signals in component signal channels for combining the signals to form a composite output signal which is representative of the vector sum of the component signals. The system includes means for providing automatic gain control of the component signals in response to the signal level of the composite signal. According to the invention, the automatic gain control means includes means responsive to the composite signal for providing a first digital signal representative of a desired attenuation within a selected attenuation range. The first digital signal has a minimum number of bits N, selected to cause the first digital signal to have a number of values at least as great as the number of selected minimum attenuation steps in the attenuation range. The invention further includes means in each of the component signal channels for attenuating the component signals. Each of the attenuating means is responsive to a corresponding applied analog attenuation control voltage. Each of the voltages has a range of voltage values to cause the attenuation means to provide attenuation over the selected attenuation range with a predetermined relation of attenuation to each of the voltage values, their being a minimum value of voltage change for each of the voltages corresponding to one of said minimum attenuation steps. The invention further includes a plurality of digital-to-analog converters, one for each of the component signal channels, for providing analog attenuation control voltages with the ranges of voltage values. Each of the converters is responsive to a corresponding second digital signal. The second digital signals have at least M bits, where the value M is selected to provide a number of second digital signal values that is at least as great as the ratio of the range of voltage values for the voltages to the minimum value of voltage change. The invention also includes a plurality of programmed digital memory means, one for each of the component signal channels and each having at least N addresses of at least M bits. Each memory is responsive to the first digital signal for providing the second digital signal to one of the digital-to-analog converters. The memories are programmed to provide second digital signals which cause the digital-to-analog converters to provide the control voltages to said attenuation devices and cause equal increments of attenuation for equal changes of the first digital signal.

In accordance with the present invention there is provided a digitally controlled RF attenuator. The attenuator provides linear attenuation over a selected attenuation range. The attenuator includes means for providing a first digital signal having a number of bits N selected to cause the first digital signal to have a number of values at least as great as a desired number of equal attenuation steps in the attenuation range. There is also provided an attenuation device, responsive to an applied analog voltage having a range of voltage values for providing attenuation over the selected attenuation range with a predetermined relationship of attenuation to the applied voltage value. The relation has a minimum value of analog voltage change in the selected attenuation range which corresponds to one of the equal attenuation steps. The attenuator also includes an M bit digital-to-analog converter having an analog output range which corresponds to at least the range of voltage values, for supplying the analog voltage to the attenuation device. The converter is responsive to a second digital signal of M bits, the value M being selected to provide a number of second digital signal values that is at least as great as the ratio of the range of voltage values to the minimum value of analog voltage change. There is also provided a programmed digital memory having at least N addresses of at least M bits each. The memory is responsive to the first digital signal for providing the second digital signal to the M bit digital-to-analog converter. The memory is programmed to provide second digital signals which cause the digital-to-analog converter to provide an analog signal to the attenuation device which causes equal increments of attenuation for equal changes of the first digital signal.

In a preferred embodiment the attenuation device is a PIN-diode attenuator. The predetermined relationship of attenuation to applied analog voltage is therefore generally non-linear. The first digital signal, in some applications, may originate as an analog signal which is provided to an analog-to-digital converter. In other applications the first digital signal may be provided by an up-down counter having N bits.

In one application, the digitally controlled attenuator can be used in a digitally controlled RF gain control system for providing linear attenuation over a selected attenuation range. In this application, there may be a plurality of such attenuators connected in series and arranged to provide the total amount of attenuation required. There may also be a plurality of digital-to-analog converters and a plurality of memories. The RF gain control system may be responsive to an RF signal level, for example, at the output of a signal combiner.

For a better understanding of the present invention, together with other and further objects, reference is made to the following description, taken in conjunction with the accompanying drawings, and its scope will be pointed out in the appended claims.

DESCRIPTION OF THE INVENTION

Figure 1:
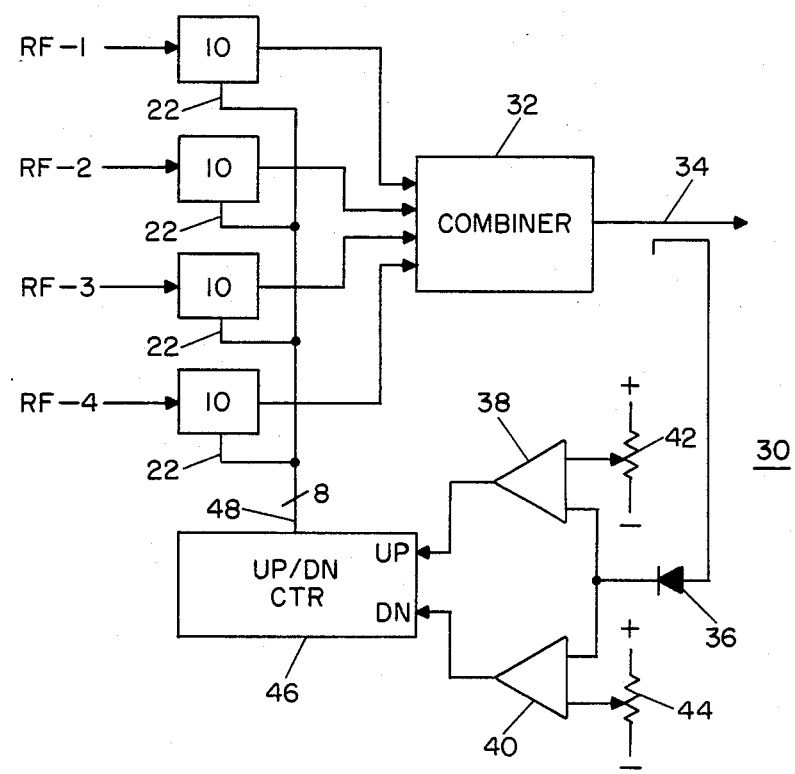
FIG. 1 is a block diagram illustrating an RF gain control system in accordance with the present invention.

FIG. 1 is a block and schematic diagram illustrating a predetection combining system in accordance with the present invention. The system illustrated in FIG. 1 has four component signal channels labeled RF-1 through RF-4. Each signal channel includes RF components typical of those used in conventional amplifying channels for such predetection combiners, an example of which is illustrated by the RF components shown in FIG. 5.

As shown in FIG. 1, each channel includes an RF attenuator 10 in accordance with the present invention, as will be further described. The system shown in FIG. 1 includes a combiner circuit 32, which includes phase shifting and weighting components which are familar to those skilled in the art. At the output of combiner 32, there is provided a coupler 34 for sampling the signal level of the composite signal which is output from combiner 32 and which represents the vector sum of the component signals provided on the four channels RF-1 through RF-4.

As previously noted, in connection with this type of combiner system, it is desirable to provide equal amplification in each of the RF or IF composite signal channels. In prior art combiners, attempts have been made to achieve accurate tracking of component channel gain by using PIN-diode attenuators with special analog circuits to achieve linear attenuation in each channel and thereby attempt to match the gain levels in the channels. Typically, such attempts result in matching of the signal gain in the composite channels to within 0.5 to 1.0 dB. over an automatic gain control range of 60 dB.

The present invention provides a higher accuracy of automatic gain control by the implementation of a digital control for the PIN-diode attenuators used in the component signal channels, according to a scheme which provides accurate linearization of the gain in each channel with matched control voltages provided for each of the attenuation devices.

The new digitally controlled AGC amplifier has virtually only one limitation; that is, the ability of the test equipment to measure it's tracking error. Current programming techniques allow the AGC amplifier to track within 0.1 dB. (5 to 10 times better than currently available combiners).

Figure 2:
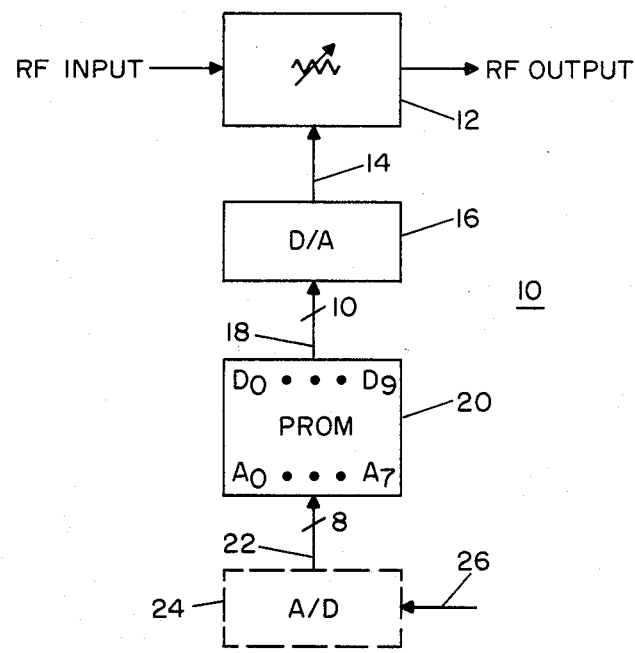
FIG. 2 is a block diagram illustrating an RF attenuator in accordance with the present invention.
Figure 3:
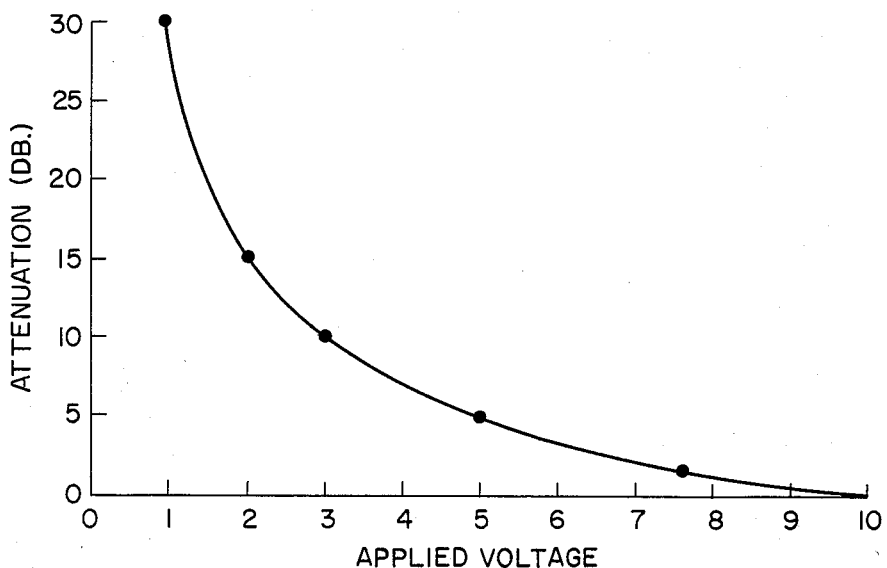
FIG. 3 is a graph illustrating PIN-diode attenuation as a function of applied voltage.

Referring to FIG. 2, there is shown an RF attenuator 10 in accordance with the present invention. The attenuator 10 includes a PIN-diode attenuator 12, of conventional design and having RF input and output ports. The diode attenuator 12 is responsive to an applied analog voltage control signal on lead 14 for providing RF attenuation. A typical attenuation characteristic for a PIN-diode attenuator of the type used in connection with the attenuator 10 of FIG. 2 is illustrated in FIG. 3. By referring to the graph of FIG. 3 it can be seen that the attenuation of the RF signal is a non-linear characteristic of applied voltage. In the case of the attenuator shown in FIG. 3, the relative attenuation range is from 30 db. at one volt to 0 db. at 10 volts.

Referring again to the receiver illustrated in FIG. 1, it is desirable to have equal amounts of attenuation in the four component RF channels, since a greater amount of attenuation in one channel may result in a loss of signal-to-noise ratio in the composite signal. It is also desirable in connection with such a receiver to provide automatic gain control by use of attenuators in the signal path prior to combination with equal levels of attenuation in all signal paths. It is well recognized that it is undesirable to provide a higher gain in one composite channel which may be receiving a signal with a low signal-to-noise ratio, since this higher gain will ultimately increase the noise in the composite output signal. Accordingly, the circuit 30 shown in FIG. 1 includes four digitally controlled RF attenuators 10 of the type shown in FIG. 2. As noted, it is desirable that these attenuators accurately track each other in attenuation in accordance with control signals of a digital nature provided on lead 48. The control signals on lead 48 are derived from a digital up-down counter 46, which responds to signals indicating that the received signal is above or below threshold values determined by potentiometers 42 and 44 and voltage comparitors 38 and 40, which respond to the composite signal from combiner 32, as sampled via coupler 34 and detected via RF detector 36. Up-down counter 46 receives counting pulses from comparitors 38 and 40, and provides a digital command signal value on lead 48 which corresponds to the amount of desired attenuation in each of attenuators 10.

Referring again to FIG. 2, it can be seen that the 8-bit first digital signal which is provided on lead 22, which is connected to lead 48 in FIG. 1 is provided to a programmable read-only memory 20 as an address signal. Programmable read-only memory 20 is provided with a program to compensate for the non-linearities of the PIN-diode used in the attenuation device 12. In the example illustrated, the programmable read only memory has an input of N=8 bits of digital data, which provide 256 possible values of data. As an example, attenuator 12, may have the characteristics illustrated in FIG. 3, and therefore provide 30 dB. range of attenuation. Accordingly, each least significant bit of the attenuation control first digital signal provided on lead 22 will correspond to 0.12 dB. attenuation. The number of bits of information N, provided as an address signal to programmable read only memory 20, must be appropriate to provide at least a number of values $2^N$ corresponding to the number of values of attenuation desired from the device. In the case of the present device, it is desirable to provide attenuation steps of 0.2 dB. or smaller, which would correspond to 150 values in a range of 30 dB. Since 150 is not an even power of two, it is appropriate to select an 8-bit digital signal, which provides 256 ($2^8$) possible steps of attenuation, each step being approximately 0.12 dB.

The programmable read-only memory 20 is programmed to provide a second digital output signal on lead 18 which corresponds to the applied voltage control signal appropriate for operating PIN-diode attenuator 12 when converted to an analog signal in digital-to-analog converter 16. In order to determine the number of bits M required for the data signal which is output from the programmable read-only memory (PROM) 20 on lead 18, it is necessary to examine the slope of the PIN-diode attenuation characteristic as a function of applied voltage. This must be considered in connection with the smallest step of attenuation desired.

In the present case, it is desired to have attenuation steps of 0.2 dB. or smaller. Examining the curve of FIG. 3, it can be seen that in the range of voltage change between 1 and 2 volts there is a large change in attenuation. In this range there is a minimum value of analog voltage change corresponding to the desired attenuation steps. The slope in this range is at least 15 dB. per volt. In order to obtain steps of 0.2 dB., it is therefore necessary to have approximately 75 steps per volt in the signal which is output from PROM 20 to digital-to-analog converter 16. Thus, the minimum voltage steps are approximately 0.013 volts. Since there is a range from 1 to 10 volts, or 9 volts, it is necessary to have at least 675 steps in the second digital signal provided to digital-to-analog converter 16. Accordingly, it is appropriate to use a digital signal having M=10 bits, which will provide 1024 voltage steps.

From the foregoing, it can be seen that the number of digital bits in the first digital signal used as an address input to PROM 20 must be selected in accordance with the attenuation steps desired, while the number of digital bits in the second digital signal used as an input to the digital-to-analog converter 16 must be determined in accordance with the minimum change in voltage for a given attenuation change of the device 12.

According to the application, it may be desired to provide an attenuator which has linear control in response to an analog voltage. In this case, the analog voltage may be supplied on lead 26 to analog-to-digital converter 24, for conversion to an N=8 bit digital signal. In this case the number of bits N is selected according to the desired accuracy of analog attenuation control, such that the number of possible values for the first digital signal ($2^N$) exceeds the ratio of the attenuation range to the desired attenuation accuracy.

Figure 4:
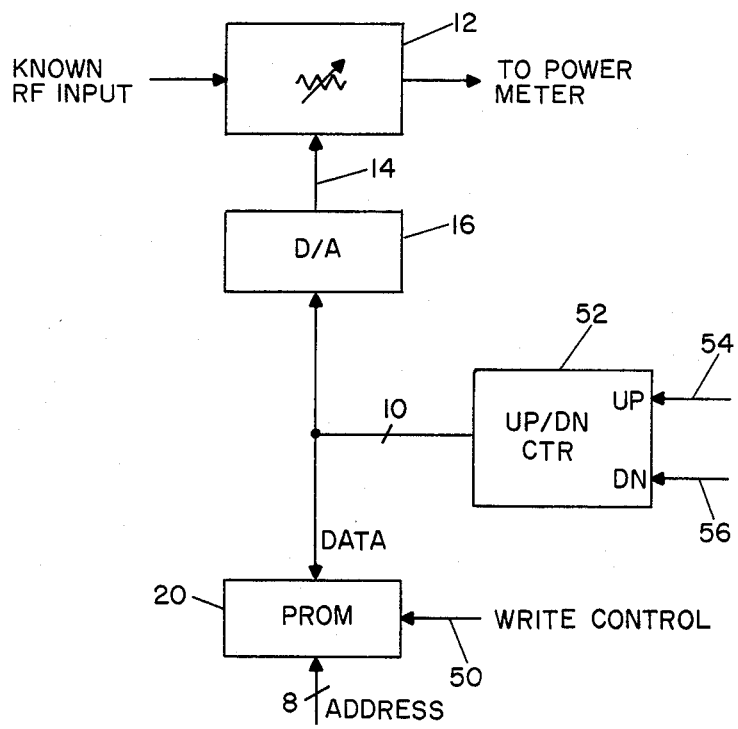
FIG. 4 is a block diagram illustrating a method of calibrating a programmable read-only memory for use in the apparatus of FIG. 1.

FIG. 4 is a block diagram of an arrangement for programming a PROM 20 to provide linear attenuation in accordance with the present invention. The attenuation device 12 is provided with a known RF input, which can be compared to its RF output by use of a power meter or bridge, as is well known to those skilled in the art.

Attenuation device 12 is supplied with an analog control voltage on line 14 which is derived from a 10 bit digital signal in digital-to-analog converter 16. The 10 bit digital signal is supplied by up-down counter 52, which is operated by signals supplied on lines 54 and 56. The output of counter 52 is supplied as a data signal to PROM 20.

To calibrate the PROM to correspond to the non-linear characteristics of attenuator 12, PROM 20 is supplied with an 8-bit address input corresponding to the desired attenuation in a digital, linear scale. Counter 52 is advanced up or down until the attenuation device 12 gives the corresponding RF attenuation. When the corresponding attenuation is achieved, a "write control" signal is supplied to PROM 20 on lead 50. The next attenuation value may then be set in a corresponding manner starting with the address input to PROM 20. Those skilled in the art will recognize that this calibration process can be easily automated to rapidly calibrate each PROM for its corresponding diode attenuator.

Figure 5:
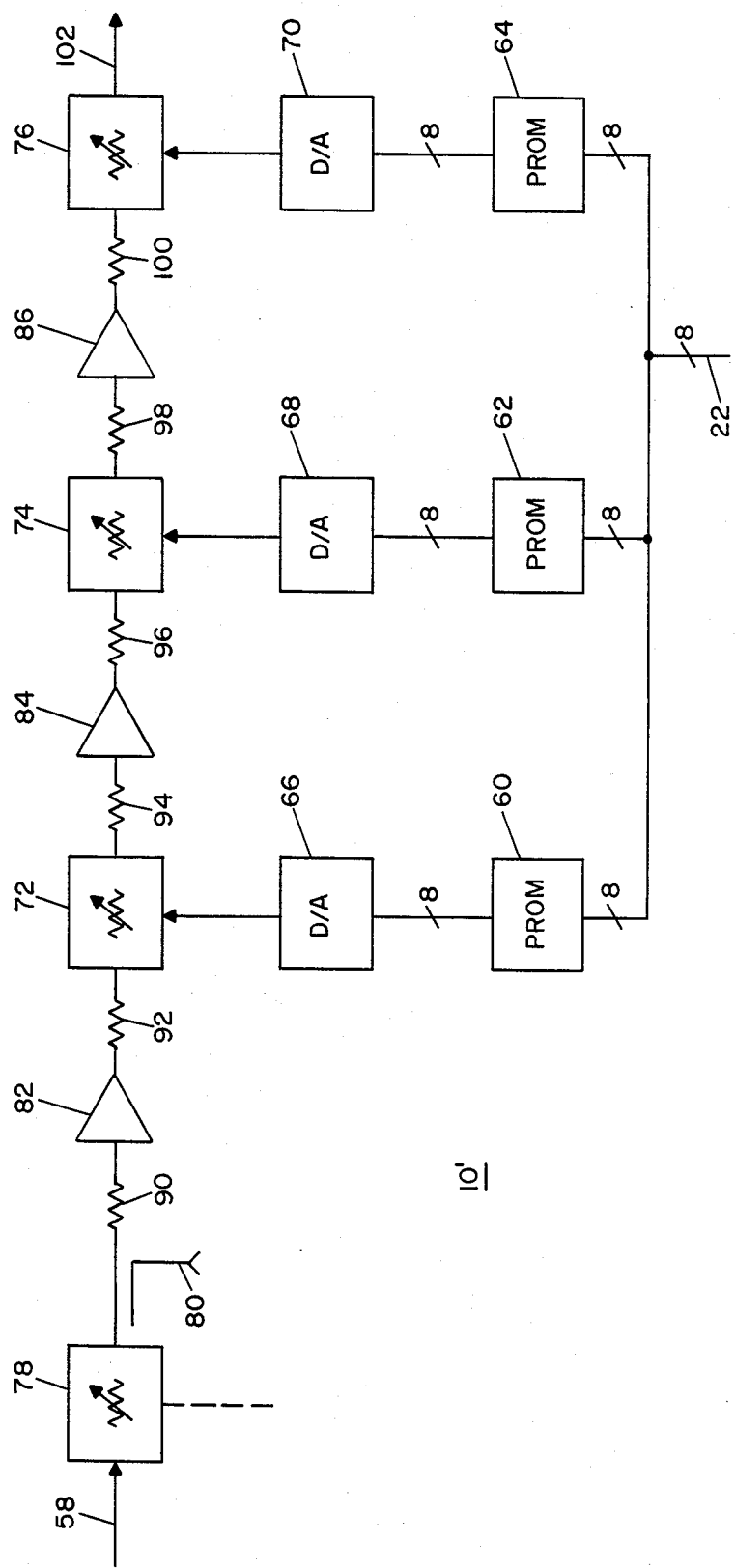
FIG. 5 is a block diagram showing an arrangement of series connected attenuators in accordance with the present invention.

FIG. 5 shows an embodiment of the invention 10′ utilized in connection with intermediate amplifiers to achieve a large range of attenuation values for automatic gain control. In the embodiment 10′ shown in FIG. 5, there are three attenuation devices 72, 74 and 76 connected in RF series between input port 58 and output port 102. The circuit 10′ shown in FIG. 5 is particularly useful in a combining arrangement 30 of the type shown in FIG. 1 wherein the circuit is supplied with digital signals supplied on lead 22 corresponding to the desired attenuation value.

The circuit 10′ shown in FIG. 5 includes a manual level setting attenuator 78 and a sampling coupler 80. These components are followed by three stages of amplifiers 82, 84 and 86, each of which may provide 26 dB. amplification. Amplifiers 82, 84, 86 are isolated by 3 dB. fixed attenuators 90, 92, 94, 96, 98 and 100.

Variable attenuators 72, 74 and 76 are each controlled by an analog control signal generated in corresponding digital-to-analog converters 66, 68 and 70. The digital-to-analog converters are each supplied with a digital signal from PROMS 60, 62 and 64. In the illustrated embodiment this digital signal is 8 bits for each of the attenuators or 24 bits total. As is evident from the above discussion, the availability of 24 bits of attenuation control will most likely provide more values of attenuation than necessary in most applications. Each of PROMS 60, 62 and 64 is addressed by the same 8-bit digital signal on control lead 22. Thus, of the many available values of attenuation, only 256 ($2^8$) can be addressed by the signal on lead 22. The arrangement shown in FIG. 5 can provide a range of attenuation values corresponding to the sum of the available attenuation of the devices 72, 74 and 76. The control circuitry comprising the memories and digital-to-analog converters can naturally be rearranged according to the particular requirements of the application. For example, there may be only a single PROM with a number of data bits determined in the same way as for the FIG. 2 embodiment and providing digital data signals to either separate digital-to-analog converters, providing multiple analog control signals, or to a single digital-to-analog converter with the same analog control signal supplied to each attenuation device.

The FIG. 5 device can be calibrated in a manner similar to the technique illustrated in FIG. 4. As an alternative to using up-down counter 52, manual switches can be used to supply second digital signals to digital-to-analog converters 66, 68 and 70 and as data signals to PROMS 60, 62 and 64. The first digital signal is supplied as an address input to PROMS 60, 62 and 64, and the switches are manually adjusted to achieve the desired attenuation corresponding to the supplied first digital signal. When the desired attenuation is achieved, a write command is supplied to the PROMS 60, 62 and 64. Automation of this process is also possible.

While there have been described what are believed to be the preferred embodiments of the invention, those skilled in the art will recognize that other and further modifications may be made thereto without departing from the spirit of the invention, and it is intended to claim all such modifications as fall within the true scope of the invention.

I claim:

1. In a predetection combining system, responsive to a plurality of component signals in component signal channels, for combining said signals to form a composite output signal representative of the vector sum of said component signals, said system including means for providing automatic gain control of said component signals responsive to the signal level of said composite signals, the improvement wherein said means for providing automatic gain control includes:

means, responsive to said composite signal, for providing a first digital signal representative of a desired attenuation within a selected attenuation range, said first digital signal having at least a number of bits N selected to cause said first digital signal to have a number of values at least as great as the number of selected minimum attenuation steps in said attenuation range;

means in each of said component signal channels for attenuating said component signals, each of said attenuation means responsive to a corresponding applied analog attenuation control voltage, each of said voltages having a range of voltage values to cause said attenuation devices to provide attenuation over said selected attenuation range with a predetermined relation of attenuation to each of said voltage values, there being a minimum value of voltage change for each of said voltages corresponding to one of said minimum attenuation steps;

a plurality of digital-to-analog converters, one for each of said component signal channels, for providing analog attenuation control voltages with said ranges of voltage values, each of said converters responsive to a respective second digital signal, said second digital signal having at least M bits, the value M being selected to provide a number of second digital signal values that is at least as great as the ratio of said range of voltage values for said voltages to said minimum value of voltage change; and a plurality of programmed digital memory means, one for each of said component signal channels, each having at least N addresses of at least M bits, and each responsive to said first digital signal for providing said second digital signals to one of said digital to analog converters, said memory means being programmed to provide second digital signals which cause said digital to analog converters to provide said control voltages to said attenuation devices and cause equal increments of attenuation for equal changes of said first digital signal.

2. A system as specified in claim 1 wherein each of said digital-to-analog converters comprises an M bit digital to analog converter.

3. A system as specified in claim 2 wherein each of said memory means comprises an N×M memory.

4. A system as specified in claim 1 wherein said means for providing said first digital signal comprises an analog-to-digital converter, responsive to a supplied analog attenuation control signal.

5. A system as specified in claim 1 wherein said means for providing said first digital signal comprises:

first means for providing a first count signal in response to a composite signal level above a selected maximum level;

second means for providing a second count signal in response to a composite signal level below a selected minimum level; and an up-down counter responsive to said first and second count signals for providing said first digital signal.

6. A digitally controlled RF gain control system, for providing linear attenuation over a selected attenuation range, comprising:

means for providing a first digital signal having a number of bits N selected to cause said first digital signal to have a number of values at least as great as a desired number of equal attenuation steps in said attenuation range;

a plurality of series connected attenuation devices, each responsive to corresponding applied attenuation control analog voltages, each of said voltages have a range of voltage values to cause said attenuation devices to collectively provide attenuation over said selection attenuation range with a predetermined relation of attenuation to each of said voltage values, there being a minimum value of analog voltage change for at least one of said voltages corresponding to one of said equal attenuation steps;

digital-to-analog converter means, for providing said attenuation control analog voltages with said ranges of voltage values to all of said attenuation devices in response to supplied second digital signals, said second digital signals having collectively at least M bits, the value M being selected to provide a number of collective second digital signal values that is at least as great as the ratio of the range of voltage values for said at least one of said voltages to said minimum value of analog voltage change; and programmed digital memory means, having at least N addresses of a at least M bits, and responsive to said first digital signal for providing said second digital signals to said digital-to-analog converter means, said memory means being programmed to provide second digital signals which cause said digital-to-analog converter means to provide said control voltages to said attenuation devices and cause equal increments of attenuation for equal changes of said first digital signal.

7. A system as specified in claim 6 wherein said digital-to-analog converter means comprises a single M bit digital-to-analog converter.

8. A system as specified in claim 6 wherein said digital-to-analog converter means comprises a plurality of digital-to-analog converters collectively responsive to at least M bits.

9. A system as specified in claim 7 wherein said memory means comprises an N×M memory.

10. A system as specified in claim 8 wherein said memory comprises an N×M memory.

11. A system as specified in claim 8 wherein said memory comprises a plurality of memories collectively having at least N addresses and providing at least M bits for each address.

12. A system as specified in claim 6 wherein said means for providing said first digital signal comprises an analog-to-digital converter, responsive to a supplied analog attenuation control signal 13. A system as specified in claim 6 for providing automatic gain control wherein said means for providing said first digital signal comprises means responsive to an RF signal level.

14. A system as specified in claim 13 wherein said means responsive to an RF signal level comprises:
 first means for providing a first count signal in response to RF signal above a selected maximum level;
 second means for providing a second count signal in response to RF signal below a selected minimum level; and
 an up-down counter responsive to said first and second count signals for providing said first digital signal.

15. A digitally controlled RF attenuator, for providing linear attenuation over a selected attenuation range, comprising:
 means for providing a first digital signal having a number of bits N selected to cause said first digital signal to have a number of values at least as great as a desired number of equal attenuation steps in said attenuation range;
 an attenuation device, responsive to an applied analog voltage having a range of voltage values for providing attenuation over said selected attenuation range with a predetermined relation of attenuation to said applied analog voltage, said relation having a minimum value of analog voltage change in said selected attenuation range corresponding to one of said equal attenuation steps;
 an M bit digital-to-analog converter, having an analog output range corresponding to at least said range of voltage values, for supplying said analog voltage to said attenuation device, and responsive to a second digital signal of M bits, the value M being selected to provide a number of second digital signal values that is at least as great as the ratio of said range of voltage values to said minimum value of analog voltage change; and
 a programmed digital memory having at least N addresses of at least M bits, and responsive to said first digital signal for providing said second digital signal to said M bit digital-to-analog converter, said memory being programmed to provide second digital signals which cause said digital-to-analog converter to provide an analog signal to said attenuation device which causes preselected increments of attenuation for equal changes of said first digital signal.

16. An RF attenuator as specified in claim 15, wherein said attenuation device is a PIN-diode attenuator and wherein said predetermined relation of attenuation to applied analog voltage is non-linear.

17. An RF attenuator as specified in claim 15 wherein said means for providing a first digital signal comprises an analog-to-digital converter.

18. An RF attenuator as specified in claim 15 wherein said means for providing a first digital signal comprises an up-down counter having at least N bits.

19. A linear RF attenuator, responsive to a first applied analog signal having a selected first analog voltage range for providing linear attenuation over a selected attenuation range with selected attenuation accuracy, comprising:
 an N bit analog-to-digital converter, responsive to said first analog voltage over said first analog voltage range, for providing an N bit first digital signal, the value N being selected to provide a number of first digital signal values which is at least as great as the ratio of said selected attenuation range to said selected attenuation accuracy;
 an attenuation device responsive to an applied second analog voltage having a second range of voltage values for providing attenuation over said selected attenuation range with a predetermined relation of attenuation to said second analog voltage, said relation having a minimum value of second analog voltage change in said selected attenuation range corresponding to said selected attenuation accuracy;
 an M bit digital-to-analog converter for supplying said second analog voltage to said attenuation device, said digital-to-analog converter having an analog output range corresponding to at least said second range of voltage values and responsive to a second digital signal of M bits, the value M being selected to provide a number of second digital signal values that exceeds the ratio of said second range of voltage values to said minimum value of second analog voltage change; and
 a programmed digital memory, responsive to said first digital signal for providing said second digital signal, said memory having at least N addresses of at least M bits, said memory being programmed to provide second digital signals which cause said digital-to-analog converter to provide a second analog voltage to said attenuation device which causes equal increments of attenuation for first digital signals corresponding to equal changes of said first analog voltage.

20. A linear RF attenuator as specified in claim 19 wherein said attenuation device comprises a PIN-diode attenuator and wherein said predetermined relation of attenuation to said second analog voltage is non-linear.

* * * * *